(12) United States Patent
Shen et al.

(10) Patent No.: US 11,380,843 B2
(45) Date of Patent: Jul. 5, 2022

(54) PHASE CHANGE MEMORY USING MULTIPLE STACKS OF PCM MATERIALS

(71) Applicant: INTERNATIONAL BUSINESS MACHINES CORPORATION, Armonk, NY (US)

(72) Inventors: Tian Shen, Clifton Park, NY (US); Heng Wu, Guilderland, NY (US); Kevin W. Brew, Albany, NY (US); Jingyun Zhang, Albany, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 48 days.

(21) Appl. No.: 16/789,502

(22) Filed: Feb. 13, 2020

(65) Prior Publication Data

US 2021/0257547 A1 Aug. 19, 2021

(51) Int. Cl.
*H01L 45/00* (2006.01)

(52) U.S. Cl.
CPC ............ *H01L 45/06* (2013.01); *H01L 45/126* (2013.01); *H01L 45/144* (2013.01)

(58) Field of Classification Search
CPC ...... H01L 45/06; H01L 45/126; H01L 45/144
See application file for complete search history.

(56) References Cited

U.S. PATENT DOCUMENTS

| 6,674,115 | B2 | 1/2004 | Hudgens et al. |
| 7,692,959 | B2 | 4/2010 | Krusin-Elbaum et al. |
| 7,719,886 | B2 | 5/2010 | Philipp et al. |
| 7,903,457 | B2 | 3/2011 | Lung |
| 7,973,384 | B2 | 7/2011 | Happ et al. |
| 8,759,808 | B2 | 6/2014 | Nodin et al. |
| 9,564,585 | B1 | 2/2017 | Lille et al. |
| 2003/0067013 | A1* | 4/2003 | Ichihara ............ G11C 13/0069 257/200 |
| 2008/0273378 | A1 | 11/2008 | Philipp et al. |
| 2009/0180314 | A1 | 7/2009 | Liu |
| 2009/0278107 | A1 | 11/2009 | Kim et al. |

(Continued)

FOREIGN PATENT DOCUMENTS

| CN | 104051622 A | 9/2014 |
| WO | 2012138615 A2 | 10/2012 |

OTHER PUBLICATIONS

Velea et al., "Thermal stability of phase change GaSb\GeTe, SnSe\GeTe and GaSb\SnSe double stacked films revealed by X-ray reflectometry and X-ray diffraction", Journal of Non-Crystalline Solids. vol. 495. Jul. 14, 2018. (pp. 11-17.).

(Continued)

*Primary Examiner* — Jerome Leboeuf
(74) *Attorney, Agent, or Firm* — Tutunjian & Bitetto, P.C.; Randall Bluestone

(57) ABSTRACT

A method is presented for improved linearity of a phase change memory (PCM) cell structure. The method includes forming a bottom electrode over a substrate, constructing a PCM stack including a plurality of PCM layers each having a different crystallization temperature over the bottom electrode, and forming a top electrode over the PCM stack. The crystallization temperature varies in an ascending order from the bottom electrode to the top electrode.

13 Claims, 8 Drawing Sheets

(56) References Cited

U.S. PATENT DOCUMENTS

| | | | |
|---|---|---|---|
| 2010/0038614 A1* | 2/2010 | Hampton | H01L 45/1625 |
| | | | 257/2 |
| 2010/0096609 A1* | 4/2010 | Kim | H01L 45/144 |
| | | | 257/2 |
| 2011/0149645 A1* | 6/2011 | Liu | G11C 13/0004 |
| | | | 365/163 |
| 2012/0326111 A1* | 12/2012 | Cheng | H01L 45/144 |
| | | | 257/2 |
| 2013/0306929 A1 | 11/2013 | Lee et al. | |
| 2014/0117301 A1* | 5/2014 | Lim | H01L 45/128 |
| | | | 257/4 |
| 2015/0243884 A1* | 8/2015 | BrightSky | H01L 45/1683 |
| | | | 257/4 |

OTHER PUBLICATIONS

Zhang et al., "Multi-bit storage in reset process of Phase-change Random Access Memory (PRAM)" Physica Status Solidi (RRL). vol. 1, No. 1. (pp. R28-R30.).

International Search Report issued in corresponding PCT Publication No. PCT/IB2021/050585 dated Apr. 26, 2021 (11 pgs).

* cited by examiner

PHASE CHANGE MEMORY USING MULTIPLE STACKS OF PCM MATERIALS

BACKGROUND

The present invention relates generally to semiconductor devices, and more specifically, to a phase change memory (PCM) cell employing multiple stacks of Ge—Sb—Te (germanium-antimony-tellurium or "GST") materials with different crystallization temperature and/or resistivity to improve device linearity.

A phase-change memory (PCM) is one of next-generation nonvolatile memory devices that are expected to meet an increasing demand for a high-performance and low-power semiconductor memory device. In PCM devices, data can be stored or erased by heating or cooling a phase-change layer therein. The PCM device can also be used for analog computing applications thanks to the potential that multiple states can exist inside the cell. Weights can be stored in the PCM cell during the training or inference of neutral networks. However, the linearity of a PCM's state is one of the issues in PCM deployment in artificial intelligence (AI) applications.

SUMMARY

In accordance with an embodiment, a method is provided for improved linearity of a phase change memory (PCM) cell structure. The method includes forming a bottom electrode over a substrate, constructing a PCM stack including a plurality of PCM layers each having a different crystallization temperature over the bottom electrode and forming a top electrode over the PCM stack. The crystallization temperature varies in an ascending order from the bottom electrode to the top electrode.

In accordance with another embodiment, a method is provided for improved linearity of a phase change memory (PCM) cell structure. The method includes forming a bottom electrode over a substrate, constructing a PCM stack including a plurality of PCM layers each having a different crystallization temperature over the bottom electrode, and forming a top electrode over the PCM stack. The crystallization temperature in a central region of the PCM stack is at a low point and the crystallization temperature at topmost and bottommost regions of the PCM stack are at a high point.

In accordance with yet another embodiment, a semiconductor device is provided for improved linearity of a phase change memory (PCM) cell structure. The semiconductor device includes a bottom electrode disposed over a substrate, a PCM stack including a plurality of PCM layers each having a different crystallization temperature disposed over the bottom electrode. and a top electrode disposed over the PCM stack. The crystallization temperature varies in a descending order within a portion or an entirety of the PCM stack.

In accordance with yet another embodiment, a semiconductor structure is provided including a bottom electrode disposed over a substrate, a PCM stack including a plurality of PCM layers each having a different crystallization temperature disposed over the bottom electrode and a top electrode disposed over the PCM stack, wherein the crystallization temperature in a central region of the PCM stack is at a low point and the crystallization temperature at topmost and bottommost regions of the PCM stack are at a high point.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
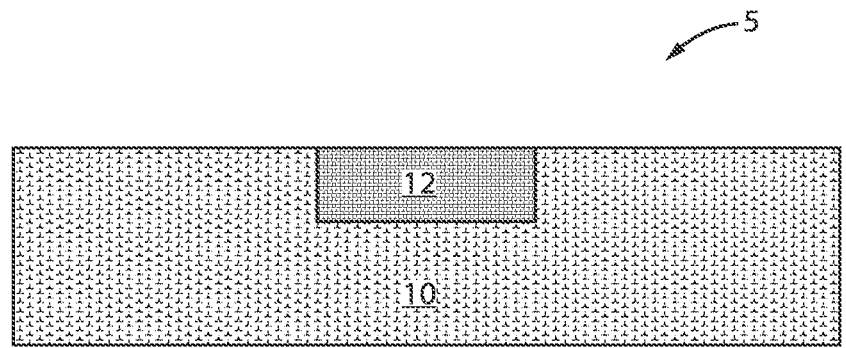
FIG. 1 is a cross-sectional view of a semiconductor structure including a bottom electrode formed over a substrate, in accordance with an embodiment of the present invention.

Embodiments in accordance with the present invention provide methods and devices for constructing a phase change memory structure or phase change memory (PCM) cell having multiple stacks of Ge—Sb—Te (germanium-antimony-tellurium or "GST") materials with different crystallization temperature and/or resistivity to improve device linearity. A mushroom GST structure and a confined cell GST structure are introduced where the crystallization temperature varies in an ascending order, or descending order, or a combination of an ascending/descending order.

Embodiments in accordance with the present invention provide methods and devices for using multiple layers of phase change material of different crystallization temperature to form a single PCM device for better linearity. No diffusion barriers or passivation layers are employed between the phase change material layers.

Embodiments in accordance with the present invention provide methods and devices for employing phase change based materials in PCM cells. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state is generally a lower current operation, requiring a current that is sufficient to raise the phase change material to a level between a phase transition temperature and a melting temperature. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a bottom electrode formed over a substrate, in accordance with an embodiment of the present invention.

A semiconductor structure 5 includes a bottom electrode 12 formed over a substrate 10. The bottom electrode 12 can be formed within the substrate 10.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline. In addition to the aforementioned types of semiconductor substrates, the semiconductor substrate 10 employed in the present invention can also include a hybrid oriented (HOT) semiconductor substrate in which the HOT substrate has surface regions of different crystallographic orientation.

The bottom electrode 12 can be, e.g., formed from Ta, Ti/TiN, W, WN, TaN, polysilicon, doped polysilicon, amorphous silicon, doped amorphous silicon, or any other suitable material, or any other conductive material. Alternatively, the bottom electrode 12 can be, e.g., any suitable conductive material or materials, e.g., Ag, Al, Cu, Ta, TaN, Ti, TiN, Al, W or any other suitable material, and can be deposited or formed in any suitable manner.

Figure 2:
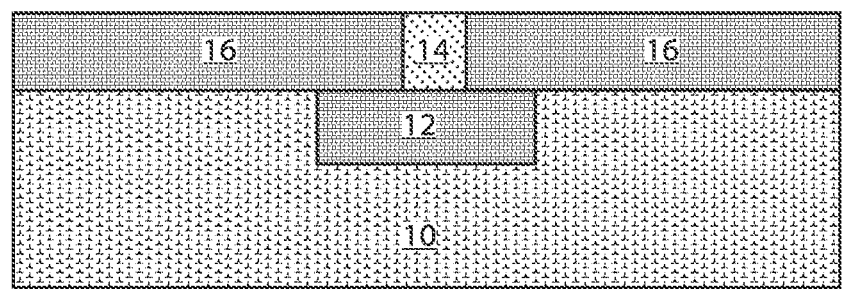
FIG. 2 is a cross-sectional view of the semiconductor structure of FIG. 1 where a heater element is deposited and patterned, in accordance with an embodiment of the present invention.

FIG. 2 is a cross-sectional view of the semiconductor structure of FIG. 1 where a heater element is deposited and patterned, in accordance with an embodiment of the present invention.

In various example embodiments, a heater element 14 is deposited and patterned.

Heater element 14 is present on a side of dielectric layer 16. Heater element 14 includes a thin layer of a refractory material having a thickness of between about 5 nanometers (nm) and about 100 nm, with a relatively high resistivity of between about 100 ohm centimeter ($\Omega$cm) and about 10,000 $\Omega$cm, e.g., of between about 500 $\Omega$cm and about 3,000 $\Omega$cm. Suitable refractory materials include, but are not limited to, tantalum nitride (TaN) and metals having the formula $Ta_xSi_yN_z$, wherein x, y and z are each between zero and about one.

The heater element 14 can include an electrically conductive material which is chemically inert when in contact with the materials used for the PCM stack and top electrode. Examples of such electrically conductive but chemically inert materials include carbon, TiN, and TaN. Both titanium nitride and tantalum nitride display a low diffusion rate for metallic elements. As a result, forming the heater element 14 out of these materials keeps metallic elements contained in the top electrode from diffusing into the PCM stack.

The dielectric material of layer 16 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4. The dielectric layer 16 can have a same thickness as the heater element 14.

Figure 3:
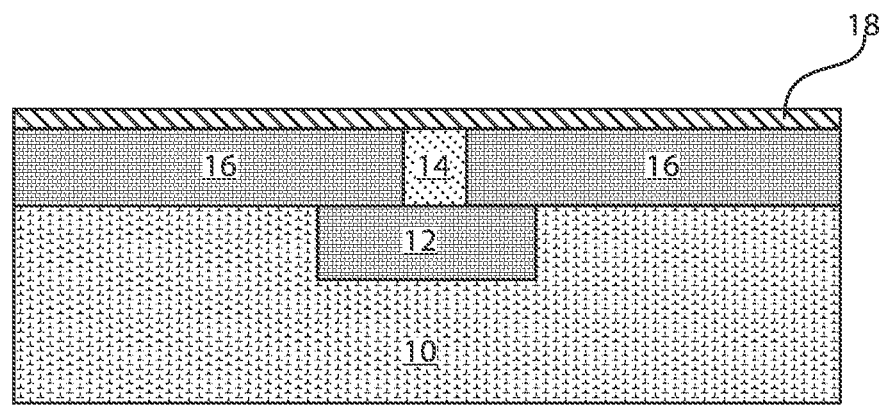
FIG. 3 is a cross-sectional view of the semiconductor structure of FIG. 2 where a resistive liner is deposited, in accordance with an embodiment of the present invention.

FIG. 3 is a cross-sectional view of the semiconductor structure of FIG. 2 where a resistive liner is deposited, in accordance with an embodiment of the present invention.

In various example embodiments, a resistive liner 18 is deposited. The resistive liner 18 can be, a metal nitride layer, such as, e.g., titanium nitride (TiN). The resistive liner 18 is employed for resistance drift correction.

In another embodiment, the resistive liner 18 can be, e.g., TaN with different types of deposition such as PVD, CVD, ALD and with different resistance values. This material is not limited by other metal types such as TiN, W, or amorphous carbon (a-C), and dielectrics such as $Al_2O_3$, $HfO_2$, SiN, $ZrO_2$ etc.

Figure 4:
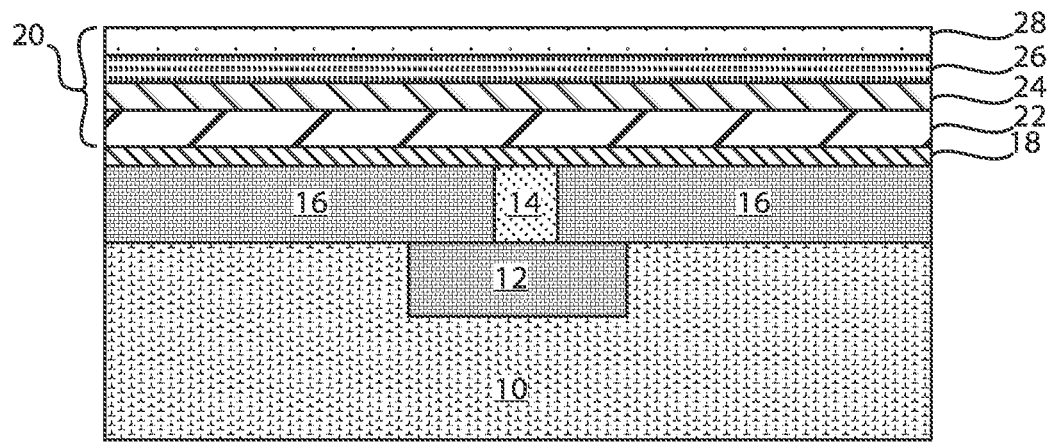
FIG. 4 is a cross-sectional view of the semiconductor structure of FIG. 3 where a Ge—Sb—Te (germanium-antimony-tellurium or "GST") stack is formed, in accordance with an embodiment of the present invention.

FIG. 4 is a cross-sectional view of the semiconductor structure of FIG. 3 where a Ge—Sb—Te (germanium-antimony-tellurium or "GST") stack is formed, in accordance with an embodiment of the present invention.

In various example embodiments, a phase change material stack 20 is deposited. The phase change material stack 20 can be a GST stack. The GST stack 20 can include a first layer 22, a second layer 24, a third layer 26, and a fourth layer 28.

In one example, the first layer 22 can be, e.g., a low germanium (Ge) concentration GST (less than 20% Ge content). The second layer 24 can be, e.g., a mid-to-low Ge concentration GST (between 20-40% Ge content). The third layer 26 can be, e.g., a mid-Ge concentration GST (between 40-70% Ge content). The fourth layer 28 can be, e.g., a high-Ge concentration GST (greater than 60% Ge content). No diffusion barriers or passivation layers are employed between the layers 22, 24, 26, 28. Thus, multiple layers of phase change material, e.g., GST, of different crystallization temperature form a single PCM device 30 for better linearity.

The GST stacks 20 can have different Ge/Te concentration to have melting T gradient, where a region closer to the heater 14 needs lower melting T and different N concentration to have different Rs, where the N can be either implanted or co-sputtered.

Figure 5:
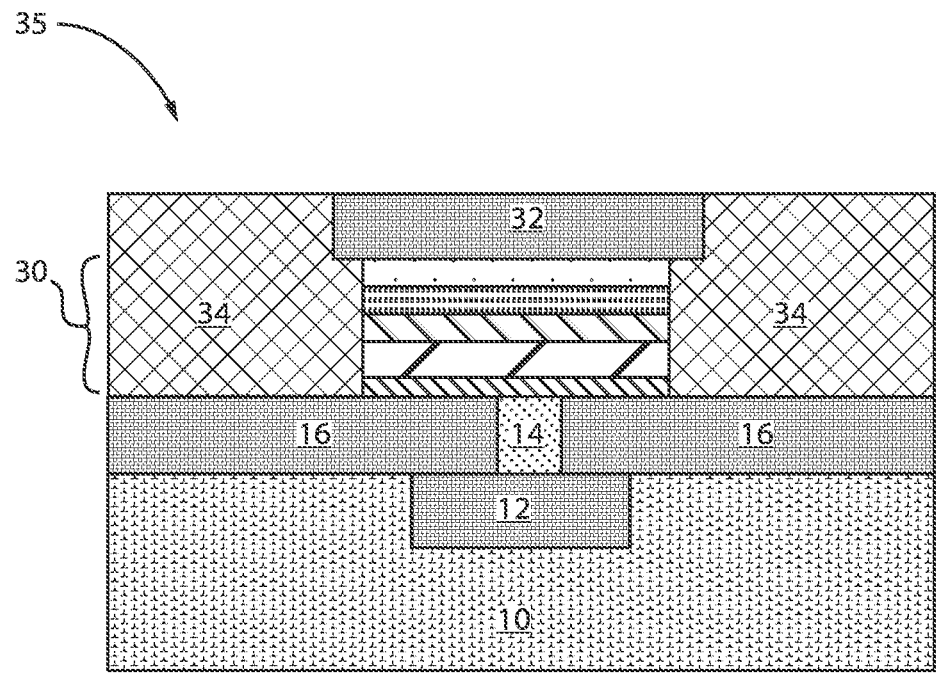
FIG. 5 is a cross-sectional view of the semiconductor structure of FIG. 4 where a top electrode is formed, in accordance with an embodiment of the present invention.

FIG. 5 is a cross-sectional view of the semiconductor structure of FIG. 4 where a top electrode is formed, in accordance with an embodiment of the present invention.

In various example embodiments, an ILD 34 is deposited and a top electrode 32 is formed within the ILD 34. The GST stack 20 can be patterned to form GST stack 30. Thus, top electrode 32 directly contacts the patterned GST stack 30.

Structure 35 illustrates the GST stack 30 formed between the top electrode 32 and the bottom electrode 12. Structure 35 thus employs multiple GST materials with different crystallization temperature and/or resistivity to improve linearity of a device. Structure 35 can be referred to as a mushroom structure where higher crystallization temperature is at the top of the GST stack 30 and lower crystallization temperature is at the bottom of the GST stack 30. Stated differently, with the addition of each layer, the crystallization temperature increases. Thus, moving from the bottom to the top of structure 35, the crystallization temperature increases. The crystallization temperature varies in an ascending order from the bottom electrode to the top electrode or, in the alternative, the crystallization temperature varies in a descending order from the top electrode to the bottom electrode. The different crystallization temperature can be achieved by doping and/or different material content.

The top electrode 32 can be, e.g., formed from Ta, Ti/TiN, W, WN, TaN, polysilicon, doped polysilicon, amorphous silicon, doped amorphous silicon, or any other suitable material, or any other conductive material. Alternatively, the top electrode 32 can be, e.g., any suitable conductive material or materials, e.g., Ag, Al, Cu, Ta, TaN, Ti, TiN, Al, W or any other suitable material, and can be deposited or formed in any suitable manner.

The ILD 34 can include any materials known in the art, such as, for example, porous silicates, carbon doped oxides, silicon dioxides, silicon nitrides, silicon oxynitrides, or other dielectric materials. The ILD 34 can be formed using any method known in the art, such as, for example, chemical vapor deposition, plasma enhanced chemical vapor deposition, atomic layer deposition, or physical vapor deposition. The ILD 34 can have a thickness ranging from about 25 nm to about 200 nm.

Phase change materials can be changed from one phase state to another by application of electrical pulses. A shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to melt the material in the active volume, and short enough to allow the material to solidify in the amorphous state.

The phase change materials can include chalcogenide based materials and other materials. Chalcogens include any of the four elements oxygen (O), sulfur (S), selenium (Se), and tellurium (Te), forming part of group VI of the periodic table. Chalcogenides include compounds of a chalcogen with a more electropositive element or radical. Chalcogenide alloys include combinations of chalcogenides with other materials such as transition metals. A chalcogenide alloy usually includes one or more elements from column six of the periodic table of elements, such as germanium (Ge) and tin (Sn). Often, chalcogenide alloys include combinations including one or more of antimony (Sb), gallium (Ga), indium (In), and silver (Ag). Phase change based memory materials can include alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable.

Chalcogenides and other phase change materials are doped with impurities in some embodiments to modify conductivity, transition temperature, melting temperature, and other properties of memory elements using the doped chalcogenides. Representative impurities employed for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide.

In the present example, the phase change material stack 30 preferably includes a Ge—Sb—Te (germanium-antimony-tellurium or "GST") alloy. Alternatively, other suitable materials for the phase change material stack 30 optionally include Si—Sb—Te alloys, Ga—Sb—Te alloys, As—Sb—Te alloys, Ag—In—Sb—Te alloys, Ge—In—Sb—Te alloys, Ge—Sb alloys, Sb—Te alloys, Si—Sb alloys, and combinations thereof.

Figure 6:
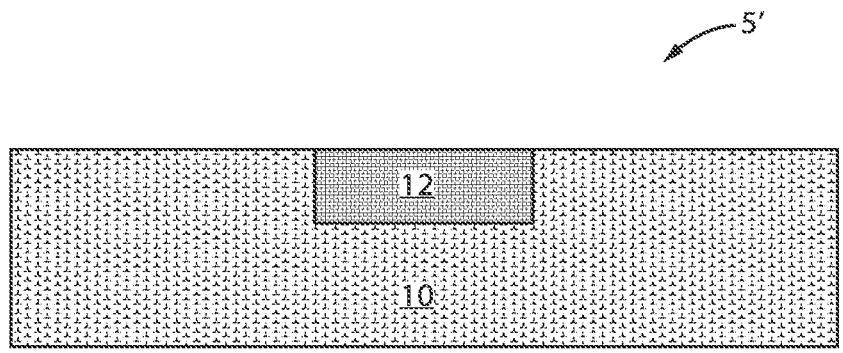
FIG. 6 is a cross-sectional view of the semiconductor structure including a bottom electrode formed over a substrate, in accordance with another embodiment of the present invention.

FIG. 6 is a cross-sectional view of the semiconductor structure including a bottom electrode formed over a substrate, in accordance with another embodiment of the present invention.

A semiconductor structure 5' includes a bottom electrode 12 formed over a substrate 10. The bottom electrode 12 can be formed within the substrate 10.

Figure 7:
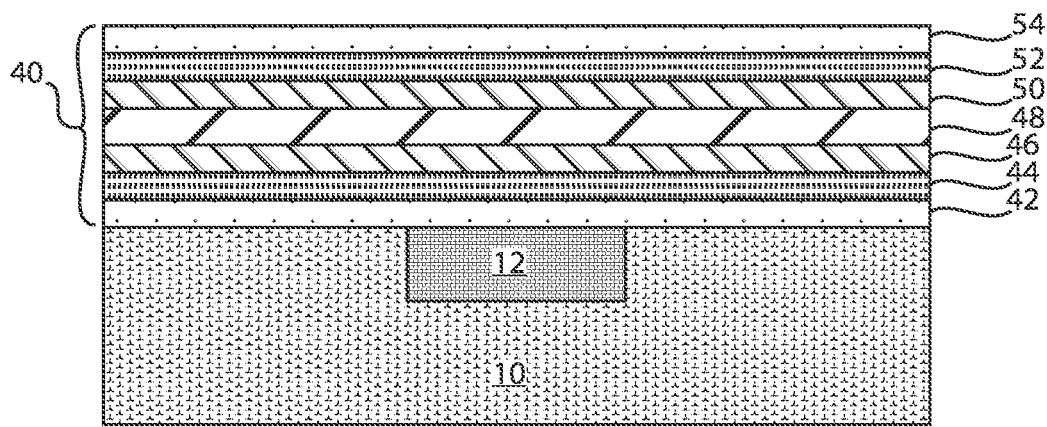
FIG. 7 is a cross-sectional view of the semiconductor structure of FIG. 6 where a GST stack is formed over the bottom electrode, in accordance with an embodiment of the present invention.

FIG. 7 is a cross-sectional view of the semiconductor structure of FIG. 6 where a GST stack is formed over the bottom electrode, in accordance with an embodiment of the present invention.

In various example embodiments, a phase change material stack 40 is deposited. The phase change material stack 40 can be a GST stack. The GST stack 40 can include a first layer 42, a second layer 44, a third layer 46, a fourth layer 48, a fifth layer 50, a sixth layer 52, and a seventh layer 54.

In one example, the first layer 42 can be, e.g., a high germanium (Ge) concentration GST (greater than 60% Ge content). The second layer 44 can be, e.g., a mid-Ge concentration GST (between 40-70% Ge content). The third layer 46 can be, e.g., a mid-low Ge concentration GST (between 20-40% Ge content). The fourth layer 48 can be, e.g., a low-Ge concentration GST (less than 20% Ge content). The fifth layer 50 can be, e.g., a mid-low Ge concentration GST (between 20-40% Ge content). The sixth layer 52 can be, e.g., a mid-Ge concentration GST (between 40-70% Ge content). The seventh layer 54 can be, e.g., a high germanium (Ge) concentration GST (greater than 60% Ge content). No diffusion barriers are employed between the layers 42, 44, 46, 48, 50, 52, 54. Thus, multiple layers of phase change material, e.g., GST, of different crystallization temperature form a single PCM device 40 for better linearity. In structure 40, a center or central or middle region has the lowest crystallization temperature.

Figure 8:
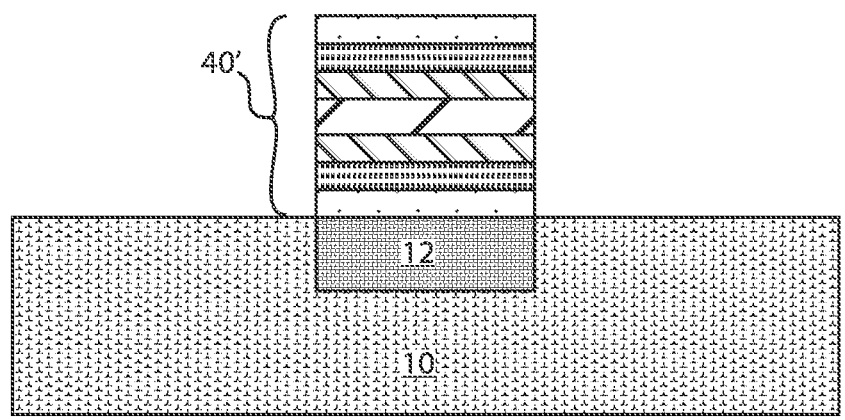
FIG. 8 is a cross-sectional view of the semiconductor structure of FIG. 7 where the phase change material stack is patterned, in accordance with an embodiment of the present invention.

FIG. 8 is a cross-sectional view of the semiconductor structure of FIG. 7 where the phase change material stack is patterned, in accordance with an embodiment of the present invention.

In various example embodiments, the phase change material stack 40 is patterned to form GST stack 40'.

Figure 9:
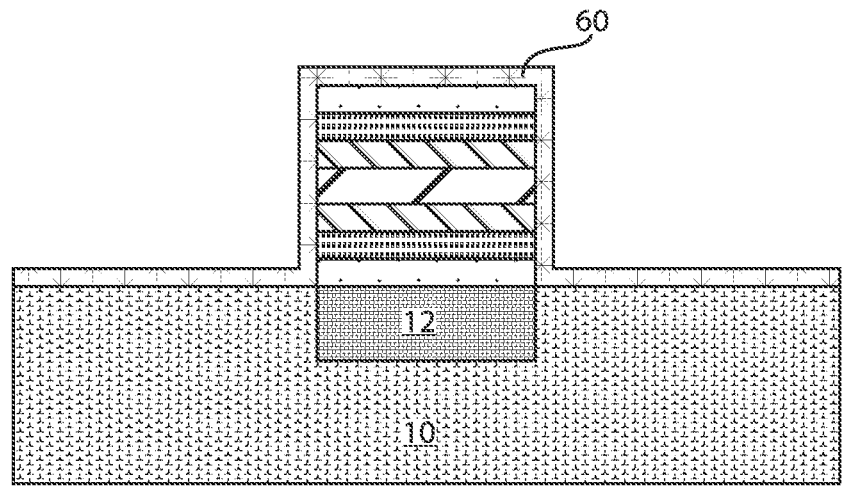
FIG. 9 is a cross-sectional view of the semiconductor structure of FIG. 8 where a resistive liner is deposited over the patterned phase change material stack, in accordance with an embodiment of the present invention.

FIG. 9 is a cross-sectional view of the semiconductor structure of FIG. 8 where a resistive liner is deposited over the patterned phase change material stack, in accordance with an embodiment of the present invention.

In various example embodiments, a resistive liner 60 is deposited over the patterned phase change material stack 40'. The resistive liner 60 is employed for resistance drift correction.

The resistive liner 60 can be a metal nitride layer, such as, e.g., titanium nitride (TiN).

In another embodiment, the resistive liner 60 can be, e.g., TaN with different types of deposition such as PVD, CVD, ALD and with different resistance values. This material is not limited by other metal types such as TiN, W, or amorphous carbon (a-C), and dielectrics such as $Al_2O_3$, $HfO_2$, SiN, $ZrO_2$ etc.

Figure 10:
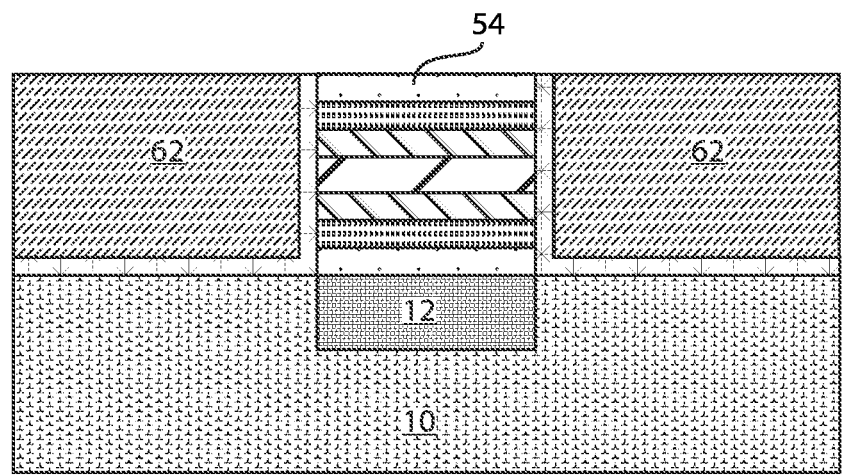
FIG. 10 is a cross-sectional view of the semiconductor structure of FIG. 9 where an inter-layer dielectric (ILD) is deposited and planarized, in accordance with an embodiment of the present invention.

FIG. 10 is a cross-sectional view of the semiconductor structure of FIG. 9 where an inter-layer dielectric (ILD) is deposited and planarized, in accordance with an embodiment of the present invention.

In various example embodiments, an ILD 62 is deposited and planarized by, e.g., chemical mechanical polishing (CMP), such that a top surface of the seventh layer 54 is exposed.

Figure 11:
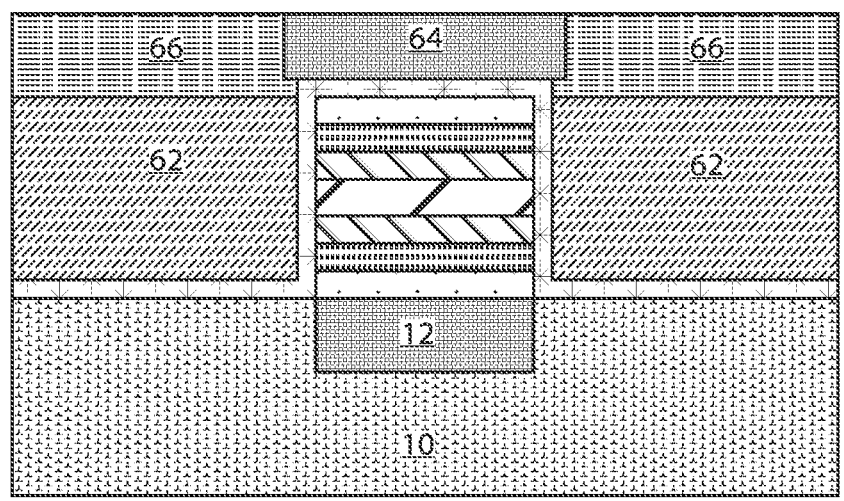
FIG. 11 is a cross-sectional view of the semiconductor structure of FIG. 10 where a top electrode is formed over the patterned phase change material stack, in accordance with an embodiment of the present invention.

FIG. 11 is a cross-sectional view of the semiconductor structure of FIG. 10 where a top electrode is formed over the patterned phase change material stack, in accordance with an embodiment of the present invention.

In various example embodiments, a top electrode 64 is formed over the patterned phase change material stack 40'. The top electrode 64 can be formed within a dielectric layer 66. In one example, the dielectric layer 66 can be an ILD layer. Structure 70 illustrates the GST stack 40' formed between the top electrode 64 and the bottom electrode 12. The top and bottom electrodes 64, 12 directly contact the GST stack 40'. The top electrode 64 also directly contacts the resistive liner 60.

Structure 70 employs multiple GST materials with different crystallization temperature and/or resistivity to improve linearity of a device. Structure 70 can be referred to as a confined cell GST structure where higher crystallization temperature is at the top of the GST stack 30 and lower crystallization temperature is at the middle or center of the GST stack 30. Stated differently, with the addition of each layer, the crystallization temperature decreases to a certain point and then increases. Thus, moving from the bottom to the middle of the structure 70, the crystallization temperature decreases until a midpoint. At the midpoint, moving from the middle to the top of the structure 70, the crystallization temperature increases until the topmost level. The crystallization temperature varies in a descending order from the bottom electrode to the middle and in an ascending order from the middle to the top electrode. The different crystallization temperature can be achieved by doping and/or different material content.

In summary, the structure of the exemplary embodiments of the present invention can be a mushroom GST structure having multiple GST stacks with different crystallization temperatures, wherein the crystallization temperature is ordered from high to low from top to bottom and wherein the different crystallization temperatures can be achieved by doping and/or different material content. The method of the exemplary embodiments of the present invention includes a confined cell GST structure having multiple GST stacks with different crystallization temperatures, wherein the crystallization temperature is ordered from high to low from top and bottom to the center and wherein the different crystallization temperatures can be achieved by doping and/or different material content. As a result, the exemplary embodiments of the present invention create multiple stakes or continuous stacks of PCM film with various G versus set pulses properties, through chemical doping of the same material and/or gradual changing of the material composition. G various from low to high, from top to bottom. By manipulating the layer composition gradient and/or thickness, an improved G linearity versus Number of set pulses can be achieved. Additionally, the same pulses are used for the entire stack.

Moreover, the exemplary embodiments of the present invention employ PCM that can be used in neuromorphic computing applications, as described below with reference to FIGS. 12 and 13. For neuromorphic computing purposes, the linearity of the conductance is valuable for the weight update. Thus, the improved linearity of the mushroom and confined cell devices described herein can be beneficial for neuromorphic computing applications.

Figure 12:
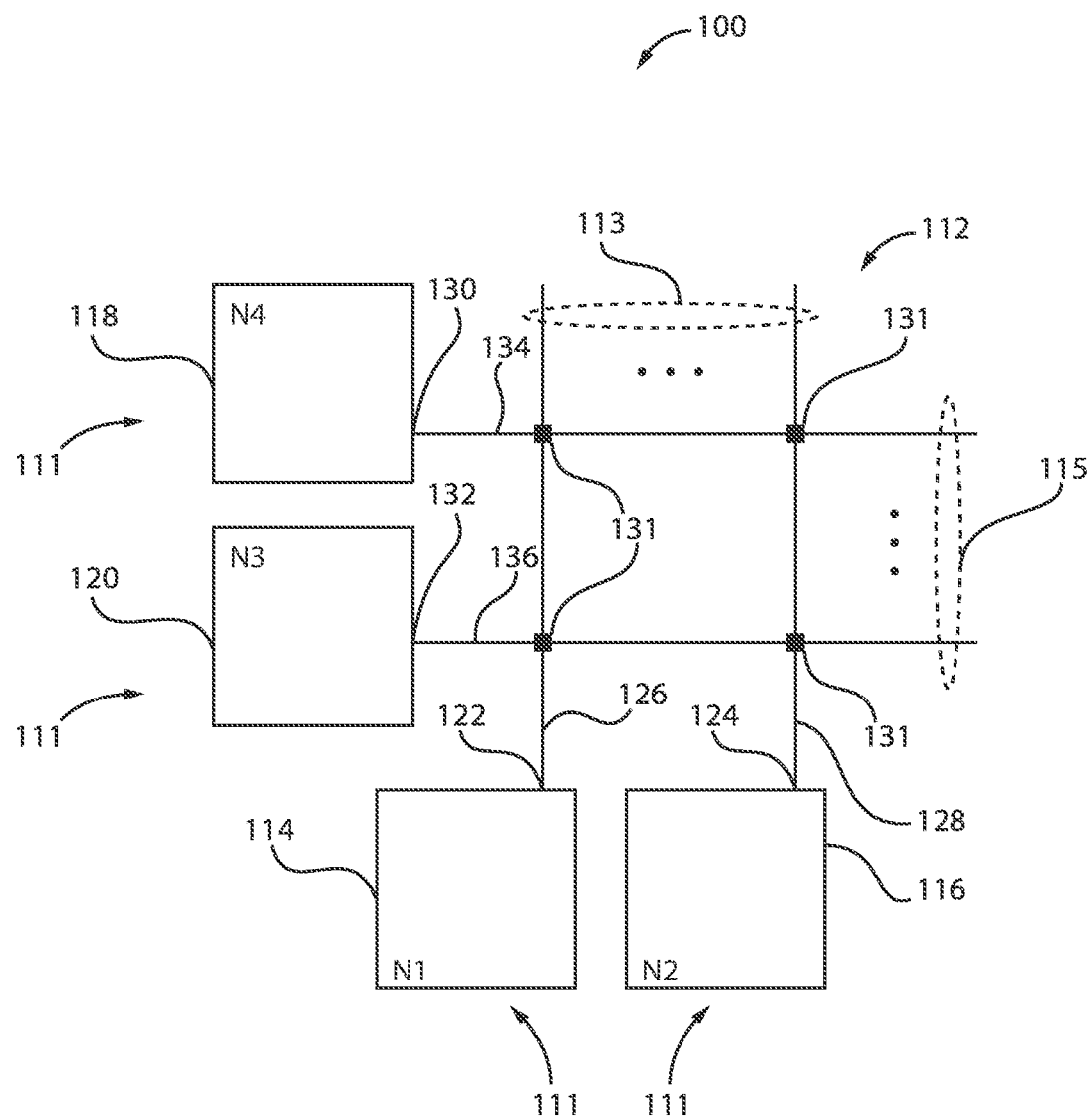
FIG. 12 is a block/flow diagram of an exemplary neuromorphic and synaptronic network including a crossbar of electronic synapses interconnecting electronic neurons and axons, in accordance with an embodiment of the present invention.

FIG. 12 is a block/flow diagram of an exemplary neuromorphic and synaptronic network including a crossbar of electronic synapses interconnecting electronic neurons and axons, in accordance with an embodiment of the present invention.

The example tile circuit 100 has a crossbar 112 in accordance with an embodiment of the invention. In one example, the overall circuit can include an "ultra-dense crossbar array" that can have a pitch in the range of about 0.1 nm to 10 μm. The neuromorphic and synaptronic circuit 100 includes the crossbar 112 interconnecting a plurality of digital neurons 111 including neurons 114, 116, 118 and 120. These neurons 111 are also referred to herein as "electronic neurons." For illustration purposes, the example circuit 100 provides symmetric connections between the two pairs of neurons (e.g., N1 and N3). However, embodiments of the invention are not only useful with such symmetric connection of neurons, but also useful with asymmetric connection of neurons (neurons N1 and N3 need not be connected with the same connection). The cross-bar in a tile accommodates the appropriate ratio of synapses to neurons, and, hence, need not be square.

In the example circuit 100, the neurons 111 are connected to the crossbar 112 via dendrite paths/wires (dendrites) 113 such as dendrites 126 and 128. Neurons 111 are also connected to the crossbar 112 via axon paths/wires (axons) 115 such as axons 134 and 136.

Neurons 114 and 116 are dendritic neurons and neurons 118 and 120 are axonal neurons connected with axons 113. Specifically, neurons 114 and 116 are shown with outputs 122 and 124 connected to dendrites (e.g., bit lines) 126 and 128, respectively. Axonal neurons 118 and 120 are shown with outputs 130 and 132 connected to axons (e.g., word lines or access lines) 134 and 136, respectively.

When any of the neurons 114, 116, 118 and 120 fire, they will send a pulse out to their axonal and to their dendritic connections. Each synapse provides contact between an axon of a neuron and a dendrite on another neuron and with respect to the synapse, the two neurons are respectively called pre-synaptic and post-synaptic.

Each connection between dendrites 126, 128 and axons 134, 136 are made through a digital synapse device 131 (synapse). The junctions where the synapse devices are located can be referred to herein as "cross-point junctions." In general, in accordance with an embodiment of the invention, neurons 114 and 116 will "fire" (transmit a pulse) in response to the inputs they receive from axonal input connections (not shown) exceeding a threshold.

Neurons 118 and 120 will "fire" (transmit a pulse) in response to the inputs they receive from external input connections (not shown), usually from other neurons, exceeding a threshold. In one embodiment, when neurons 114 and 116 fire they maintain a postsynaptic-STDP (post-STDP) variable that decays. For example, in one embodiment, the decay period can be 50 ms. The post-STDP variable is used to achieve STDP by encoding the time since the last firing of the associated neuron. Such STDP is used to control long-term potentiation or "potentiation," which in this context is defined as increasing synaptic conductance. When neurons 118, 120 fire they maintain a pre-STDP (presynaptic-STDP) variable that decays in a similar fashion as that of neurons 114 and 116.

Pre-STDP and post-STDP variables can decay according to exponential, linear, polynomial, or quadratic functions, for example. In another embodiment of the invention, the variables can increase instead of decreasing over time. In any event, this variable can be used to achieve STDP by encoding the time since the last firing of the associated neuron. STDP is used to control long-term depression or "depression," which in this context is defined as decreasing synaptic conductance. Note that the roles of pre-STDP and post-STDP variables can be reversed with pre-STDP implementing potentiation and post-STDP implementing depression.

An external two-way communication environment can supply sensory inputs and consume motor outputs. Digital neurons 111 implemented using complementary metal oxide semiconductor (CMOS) logic gates receive spike inputs and integrate them. In one embodiment, the neurons 111 include comparator circuits that generate spikes when the integrated input exceeds a threshold. In one embodiment, binary synapses are implemented using transposable 1-bit static random-access memory (SRAM) cells, wherein each neuron 111 can be an excitatory or inhibitory neuron (or both). Each learning rule on each neuron axon and dendrite are reconfigurable as described below. This assumes a transposable access to the crossbar memory array. Neurons that spike are selected one at a time sending spike events to corresponding axons, where axons could reside on the core or somewhere else in a larger system with many cores.

The term electronic neuron as used herein represents an architecture configured to simulate a biological neuron. An electronic neuron creates connections between processing elements that are roughly functionally equivalent to neurons of a biological brain. As such, a neuromorphic and synaptronic system including electronic neurons according to embodiments of the invention can include various electronic circuits that are modeled on biological neurons. Further, a neuromorphic and synaptronic system including electronic neurons according to embodiments of the invention can include various processing elements (including computer simulations) that are modeled on biological neurons. Although certain illustrative embodiments of the invention are described herein using electronic neurons including electronic circuits, the present invention is not limited to electronic circuits. A neuromorphic and synaptronic system according to embodiments of the invention can be implemented as a neuromorphic and synaptronic architecture including circuitry, and additionally as a computer simulation. Indeed, embodiments of the invention can take the form of an entirely hardware embodiment, an entirely software embodiment, or an embodiment including both hardware and software elements.

Figure 13:
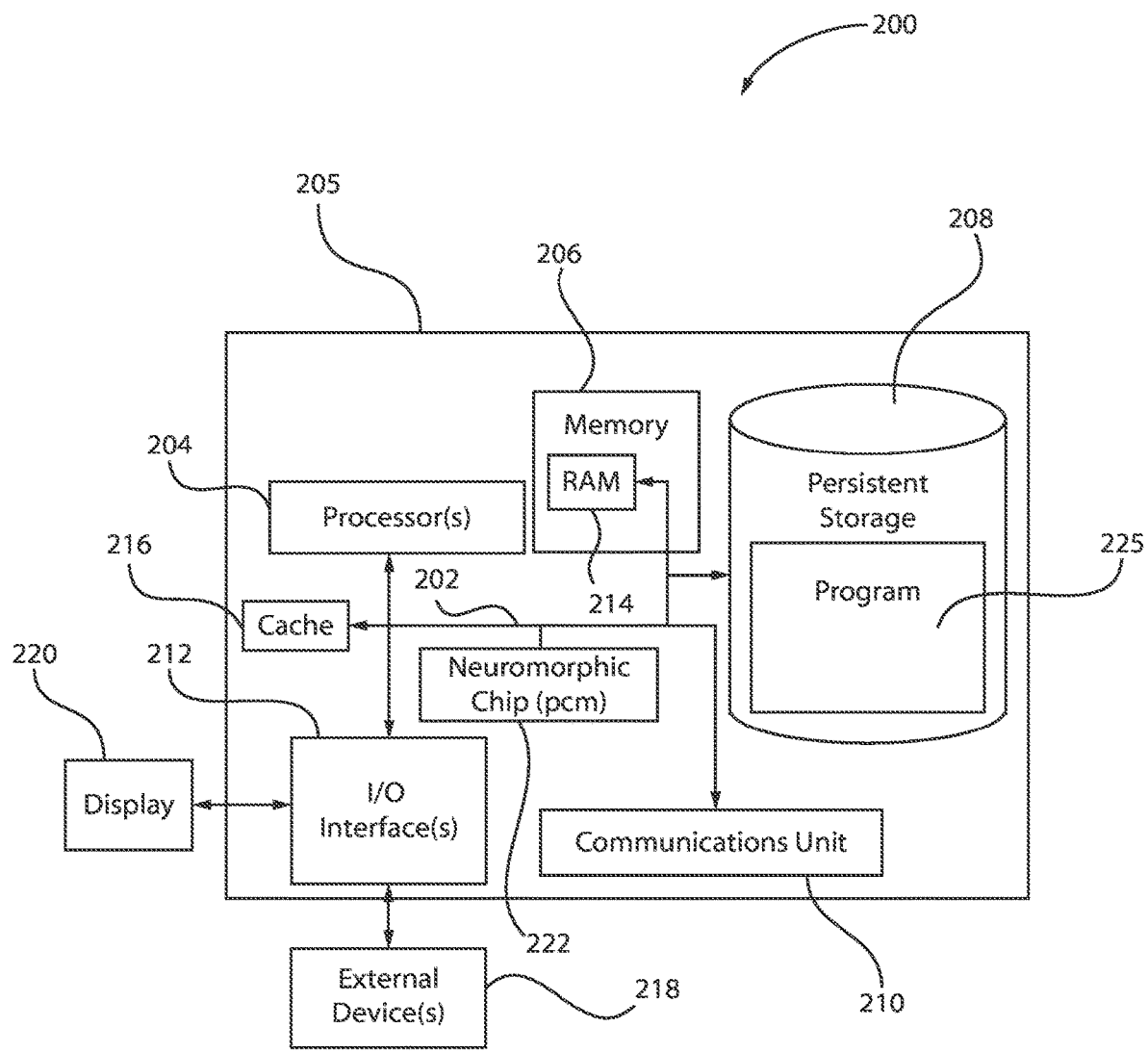
FIG. 13 depicts a block diagram of components of a computing system including a computing device and a neuromorphic chip, in accordance with an embodiment of the present invention.

FIG. 13 depicts a block diagram of components of a computing system including a computing device and a neuromorphic chip, in accordance with an embodiment of the present invention.

FIG. 13 depicts a block diagram of components of system 200, which includes computing device 205. It should be appreciated that FIG. 13 provides only an illustration of one implementation and does not imply any limitations with regard to the environments in which different embodiments can be implemented. Many modifications to the depicted environment can be made.

Computing device 205 includes communications fabric 202, which provides communications between computer processor(s) 204, memory 206, persistent storage 208, communications unit 210, and input/output (I/O) interface(s) 212. Communications fabric 202 can be implemented with any architecture designed for passing data and/or control information between processors (such as microprocessors, communications and network processors, etc.), system memory, peripheral devices, and any other hardware components within a system. For example, communications fabric 202 can be implemented with one or more buses.

Memory 206, cache memory 216, and persistent storage 208 are computer readable storage media. In this embodiment, memory 206 includes random access memory (RAM) 214. This memory 214 can also be phase change memory of the exemplary embodiments of the present invention. In general, memory 206 can include any suitable volatile or non-volatile computer readable storage media.

In some embodiments of the present invention, deep learning program 225 is included and operated by neuromorphic chip 222 as a component of computing device 205. In other embodiments, deep learning program 225 is stored in persistent storage 208 for execution by neuromorphic chip 222 in conjunction with one or more of the respective computer processors 204 via one or more memories of memory 206. In this embodiment, persistent storage 208 includes a magnetic hard disk drive. Alternatively, or in addition to a magnetic hard disk drive, persistent storage 208 can include a solid state hard drive, a semiconductor storage device, read-only memory (ROM), erasable programmable read-only memory (EPROM), flash memory, or any other computer readable storage media that is capable of storing program instructions or digital information.

The media used by persistent storage 208 can also be removable. For example, a removable hard drive can be used for persistent storage 208. Other examples include optical and magnetic disks, thumb drives, and smart cards that are inserted into a drive for transfer onto another computer readable storage medium that is also part of persistent storage 208.

In some embodiments of the present invention, neuromorphic chip 222 is included in computing device 205 and connected to communications fabric 202. Neuromorphic chip 222 includes electronic logic to provide stacked restricted Boltzmann machines, and a feed forward neural network, including deep learning algorithmic components that are trainable and perform machine learning. In other embodiments, the logistical and algorithmic components operations are performed by specialized data structures, included within computing device 205, which perform the deep learning functions of the stacked restricted Boltzmann machines, and feed forward neural network.

Communications unit 210, in these examples, provides for communications with other data processing systems or devices, including resources of distributed data processing environment. In these examples, communications unit 210 includes one or more network interface cards. Communications unit 210 can provide communications through the use of either or both physical and wireless communications links. Deep learning program 225 can be downloaded to persistent storage 208 through communications unit 210.

I/O interface(s) 212 allows for input and output of data with other devices that can be connected to computing system 200. For example, I/O interface 212 can provide a connection to external devices 218 such as a keyboard, keypad, a touch screen, and/or some other suitable input device. External devices 218 can also include portable computer readable storage media such as, for example, thumb drives, portable optical or magnetic disks, and memory cards.

Display 220 provides a mechanism to display data to a user and can be, for example, a computer monitor.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a PCM cell employing multiple stacks of GST materials with different crystallization temperature and/or resistivity to improve device linearity (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for improved linearity of a phase change memory (PCM) cell structure, the method comprising:
    forming a bottom electrode over a substrate;
    forming a heating element in direct contact with a top surface of the bottom electrode;
    forming a resistive liner defining a planar surface across its entire length, such that the planar resistive liner surface extends, in its entirety, above a top surface of the heating element;
    constructing a PCM stack including a plurality of PCM layers each having a different crystallization temperature over the bottom electrode, the PCM stack directly contacting a top surface of the resistive liner; and
    forming a top electrode over the PCM stack,
    wherein the crystallization temperature varies in an ascending order from the bottom electrode to the top electrode.

2. The method of claim 1, wherein each of the plurality of PCM layers includes a Ge—Sb—Te (germanium-antimony-tellurium or "GST") alloy.

3. The method of claim 1, wherein the plurality of PCM layers includes four layers.

4. The method of claim 3, wherein the first layer includes germanium (Ge) content of less than 20%, the second layer includes Ge content of between 20-40%, the third layer includes Ge content of between 40-70%, and the fourth layer includes Ge content of greater than 60%.

5. The method of claim 1, wherein a width of the heating element is less than a width of the bottom electrode.

6. The method of claim 5, wherein the resistive liner is employed for resistance drift correction.

7. The method of claim 1, wherein the different crystallization temperatures are achieved by doping and/or different material content.

8. A semiconductor structure comprising:
    a bottom electrode disposed over a substrate;
    a heating element disposed in direct contact with a top surface of the bottom electrode;

a resistive liner defining a planar surface across its entire length, such that the planar resistive liner surface extends, in its entirety, above a top surface of the heating element;
a phase change memory (PCM) stack including a plurality of PCM layers each having a different crystallization temperature disposed over the bottom electrode, the PCM stack directly contacting a top surface of the resistive liner; and
a top electrode disposed over the PCM stack,
wherein the crystallization temperature varies in a descending order within a portion or an entirety of the PCM stack.

9. The semiconductor structure of claim 8, wherein each of the plurality of PCM layers includes a Ge—Sb—Te (germanium-antimony-tellurium or "GST") alloy.

10. The semiconductor structure of claim 8, wherein the different crystallization temperatures are achieved by doping and/or different material content.

11. The semiconductor structure of claim 8, wherein a first layer of the PCM stack includes germanium (Ge) content of less than 20%, a second layer of the PCM stack includes Ge content of between 20-40%, a third layer of the PCM stack includes Ge content of between 40-70%, and a fourth layer of the PCM stack includes Ge content of greater than 60%.

12. The semiconductor structure of claim 8, wherein the descending order is from the top electrode to the bottom electrode.

13. A semiconductor structure comprising:
a bottom electrode disposed over a substrate;
a heating element disposed in direct contact with a top surface of the bottom electrode;
a resistive liner defining a planar surface across its entire length, such that the planar resistive liner surface extends, in its entirety, above a top surface of the heating element;
a phase change memory (PCM) stack including a plurality of PCM layers each having a different crystallization temperature disposed over the bottom electrode, wherein each of the plurality of PCM layers includes a Ge—Sb—Te (germanium-antimony-tellurium or "GST") alloy, the PCM stack directly contacting a top surface of the resistive liner; and
a top electrode disposed over the PCM stack,
wherein the crystallization temperature varies in an ascending order from the bottom electrode to the top electrode.

* * * * *